(12) United States Patent
Mizukawa et al.

(10) Patent No.: US 7,218,847 B2
(45) Date of Patent: May 15, 2007

(54) HEATING UNIT FOR HEATING A WORKPIECE WITH LIGHT-ABSORBING HEAT CONDUCTING LAYER

(75) Inventors: Yoichi Mizukawa, Hyogo (JP); Koji Miyauchi, Hyogo (JP)

(73) Assignee: Ushio Denki Kabushiki Kasiha, Tokyo (JP)

( * ) Notice: Subject to any disclaimer, the term of this patent is extended or adjusted under 35 U.S.C. 154(b) by 0 days.

(21) Appl. No.: 10/970,181

(22) Filed: Oct. 22, 2004

(65) Prior Publication Data

US 2005/0089317 A1 Apr. 28, 2005

(30) Foreign Application Priority Data

Oct. 24, 2003 (JP) .............................. 2003-364398

(51) Int. Cl.
*A45D 20/40* (2006.01)

(52) U.S. Cl. ...................... 392/407; 392/418; 219/521

(58) Field of Classification Search ................ 392/418, 392/407, 432, 411–416; 219/521, 385, 460.1–462.1, 219/463.1–464.1, 444.1, 220; 250/504 R, 250/495.1, 492.1, 492.2; 118/724–725, 728
See application file for complete search history.

(56) References Cited

U.S. PATENT DOCUMENTS

| | | | | |
|---|---|---|---|---|
| 535,321 | A | * | 3/1895 | Delany .......................... 338/217 |
| 2,601,011 | A | * | 6/1952 | Wilcox ....................... 219/456.1 |
| 3,395,631 | A | * | 8/1968 | Smith ........................... 355/100 |
| 3,798,415 | A | * | 3/1974 | Graham ........................ 219/441 |
| 5,220,155 | A | * | 6/1993 | Cunningham ........... 219/448.11 |
| 5,953,492 | A | * | 9/1999 | Yabe et al. .................. 392/418 |
| 6,282,399 | B1 | * | 8/2001 | Tokimatsu et al. ........... 399/330 |
| 6,345,169 | B1 | * | 2/2002 | Haneda et al. ............... 399/328 |
| 2003/0141291 | A1 | * | 7/2003 | Heidari et al. ............ 219/460.1 |

FOREIGN PATENT DOCUMENTS

| | | | |
|---|---|---|---|
| DE | 144656 | * | 10/1980 |
| EP | 300938 | * | 1/1989 |
| GB | 2137060 | * | 9/1984 |
| JP | 60-145629 | * | 8/1985 |
| JP | 61-219130 | * | 9/1986 |
| JP | 63-63773 | * | 3/1988 |
| JP | 63-257221 | * | 10/1988 |
| JP | 3-291940 | * | 12/1991 |

(Continued)

OTHER PUBLICATIONS

"Effecting a Hermetic Seal in a Glass System," IBM Tech. Discl. Bull., vol. 15, No. 2, p. 622-3, Jul. 1972.*

*Primary Examiner*—Thor S. Campbell
(74) *Attorney, Agent, or Firm*—Rader, Fishman & Grauer PLLC (57) ABSTRACT

A heating unit heats a work piece 6 by heat conduction from a heat conducting plate 4 on which light from a light source 1 is irradiated, wherein the heat conducting plate 4 comprises a holding member 2 having optical transparency, and a heat conducting layer 3 which is provided on a surface of the holding member 2, and absorbs light emitted from a light source 1 and is transmitted through the holding member 2, so as to generate heat. The heating unit has the heat conducting plate 4 in which deformation does not occur, and temperature thereof changes rapidly.

15 Claims, 7 Drawing Sheets

FOREIGN PATENT DOCUMENTS

| | | | |
|---|---|---|---|
| JP | 4-275417 | * | 10/1992 |
| JP | 5-76699 | * | 3/1993 |
| JP | 05-267183 A | | 10/1993 |
| JP | 06-132233 A | | 5/1994 |
| JP | 06-260422 A | | 9/1994 |
| JP | 07-172996 A | | 7/1995 |
| JP | 10-321547 A | | 12/1998 |
| JP | 2001-27860 | * | 1/2001 |
| JP | 2001-332607 A | | 11/2001 |

* cited by examiner

| Point | Elapsed Time(s) | $\Delta T_{DLC}$ (°C) | $\Delta T_C$ (°C) |
|---|---|---|---|
| A | 10 | 0.8 | <0.1 |
| B | 15 | 0.4 | <0.1 |
| C | 25 | 0.1 | <0.1 |

HEATING UNIT FOR HEATING A WORKPIECE WITH LIGHT-ABSORBING HEAT CONDUCTING LAYER

FIELD OF THE INVENTION

The present invention relates to a light emitting type heating unit which heat-treats a substrate, such as a wafer and a display panel etc.

DESCRIPTION OF THE RELATED ART

Conventionally, in a process in which a semiconductor wafer is treated, various heat-treatments, such as a annealing treatment, and a film forming processing, and a weld slag processing, are used. Moreover, such heat-treatment in the wafer processing is also performed in a glass substrate treatment process for manufacturing a display panel. A sheath heater or a carbon heater is used as a heating unit which is used as such a heating means provided in an apparatus for performing a heating treatment. Moreover, there is a light emitting type heating unit in which a halogen lamp for efficiently emitting infrared rays, as such a heating means is used. A heating apparatus for heating a glass substrate, in which a lamp is used as a heating means, is disclosed in Japanese Laid Open Patent No. 6-260422. In such a heating apparatus in which a lamp is used as a heating means, there is an advantage that the temperature of a wafer or glass substrate can be controlled in a short time, by changing an output of a lamp.

Moreover, a wafer or a glass substrate must be heated so that the temperature distribution on the surface of a wafer or glass substrate becomes uniform when heating the wafer or glass substrate (which is hereinafter referred to as a work piece). This is because, for example, if temperature distribution is uneven or non-uniform when a film is formed, the thickness of the film also becomes uneven or non-uniform according to the unevenness or non-uniformity of the distribution, thereby causing poor performance.

In order to solve such a problem, a component called a heat spreader is generally provided between a work piece and a heating means (a lamp in case of a light emitting type heating unit). When a work piece is heated, heat from the heating means conducts across to the entire heat spreader with uniform distribution so that the temperature distribution of the work piece can be made uniform. The heat spreader, made of metal or carbon having good heat conductivity, is well known. A heat spreader made from a stainless plate is disclosed in a Japanese Laid Open Patent No. 7-172996.

SUMMARY OF THE INVENTION

Although, usually, a heat spreader is suitable if it is high in heat conductivity, thick, large in size and large in heat capacity in order to make it difficult for disturbance to affect the heat spreader during heating, in case of a light emitting type heating unit, if the heat capacity of the heat spreader is made large, the response time of the temperature change of the heat spreader to output change of the lamp which is a heating means will become long, and temperature control of the work piece will become difficult in a short time. Therefore, when the work piece at room temperature is carried into a processing apparatus for heat-treatment, in order to raise the temperature to a desired preset point as quickly as possible, it is desirable that the heat capacity of the heat spreader be small and the temperature of the heat spreader follow the output change of the lamp for a short time.

Therefore, although it is desirable that a heat spreader used for a heating unit have small heat capacity unless the temperature distribution of a work piece is affected, there is no method besides making the heat spreader thin, in order to make the heat capacity of the heat spreader small, since the area of the heat spreader cannot be made smaller than that of the work piece to be heated.

If a conventional thin heat spreader which is made of metal or carbon graphite and has, for example, 3 mm thickness is used, the problems set forth below will arise.

When a metal plate is used as a heat spreader, warpage (deformation) occurs while using it. Since the surface temperature of the heating means (lamp) side of the heat spreader tends to become higher than that of the work piece side of the heat spreader during heating, heat distortion arises. That is, the heat distortion arises because the heat spreader having thin thickness cannot withstand stress due to the heat distortion.

Moreover, in case that a heat spreader made from a carbon board is used, when the heat spreader is left for a while after processing molding, about 1 mm warpage (deformation) per 300 mm length may occur. It has been viewed that remnant distortion which occurred at the time of processing is released gradually, as the carbon plate which has been heated to a high temperature at the time of processing is cooled.

If there is such warpage or deformation in the heat spreader, the interval between the heat spreader and a work piece becomes less uniform. For example, in the case that a carbon board has about 1 mm warpage per 300 mm in length, 1 mm interval difference is produced between the both ends in the diameter direction of the φ 300 mm wafer. If the interval between the heat spreader and the work piece is not constant, the quantity of heat conducted to the work piece from the heat spreader changes with places, so that the work piece cannot be heated with uniform temperature distribution.

In view of the above various problems, it is an object of the present invention to provide a heating unit in a light emitting type heating processing unit, having a heat conducting plate in which deformation thereof rarely occurs and temperature thereof changes quickly according to output change of a lamp, in place of the conventional heat spreader.

The object of the present invention is achieved by a heating unit for heating a work piece by heat conduction from a heat conducting plate on which light from a light source is irradiated, wherein the heat conducting plate comprises a holding member having optical transparency, and a heat conducting layer which is provided on a surface of the holding member, and absorbs light emitted from a light source and is transmitted through the holding member, so as to generate heat. Accordingly, it is possible to reduce deformation of the heat conducting plate and make temperature of the heat conducting plate change quickly according to the output change of the lamp.

The heat conducting layer may be made of diamond-like carbon, metal oxide, such as chromic oxide, nitride such as aluminum nitride and boron nitride, silicon carbide, metal such as silver and golden paste, silicide etc. such as molybdenum silicide. Accordingly it is possible to form, by CVD or sputtering, the heat conducting layer having desirable thickness, which is chemically strong, has contamination resistance, and excels in heat resistance and heat conductivity, and which intercepts ultraviolet rays to visible light and generates heat.

The holding member may be glass, such as silica glass borosilicate glass, sintering silica glass, and soda lime glass, glass ceramics, translucent alumina, and sapphire. It is possible to easily prepare the chemically strong holding member having excellent heat resistance, since thermal expansion coefficient thereof is small, compared with metal or carbon graphite, so that deformation will not be produced, and mainly from ultraviolet rays to visible light transmit the holding member so that much heat is not created.

Furthermore, the thickness of the holding member may be changed with places. It is possible to bring the temperature distribution of the heat conducting layer close to more uniform distribution even though there is some unevenness of intensity of radiation from a light source.

Moreover, it is possible to bring the temperature distribution of the heat conducting layer close to more uniform distribution, taking into account gas or air moving direction, by making thickness of the holding member at one end thicker than that of the holding member at other end.

A center portion of the holding member may be thickened.

A portion of the holding member, which is close to the light source, may be made thin.

A portion of the holding member, which is far from the light source, may be thickened.

One end of the heat conducting plate may thicker than other end of the heat conducting plate.

One end of the holding member may be thicker than other end of the holding member.

The holding member may have at least one recess on a side of the light source.

Moreover, the object of the present invention is achieved by a heating unit for heating a work piece comprising a light source, and a heat conducting unit including a holding member having optical transparency, and a heat conducting layer which is provided on the holding member, wherein the heat conducting layer absorbs light which is emitted from the light source and is transmitted through the holding member.

DESCRIPTION OF THE PREFERRED EMBODIMENTS

Embodiments according to the present invention will be described referring to FIGS. 1 through 9.

Figures 1A, 1B:
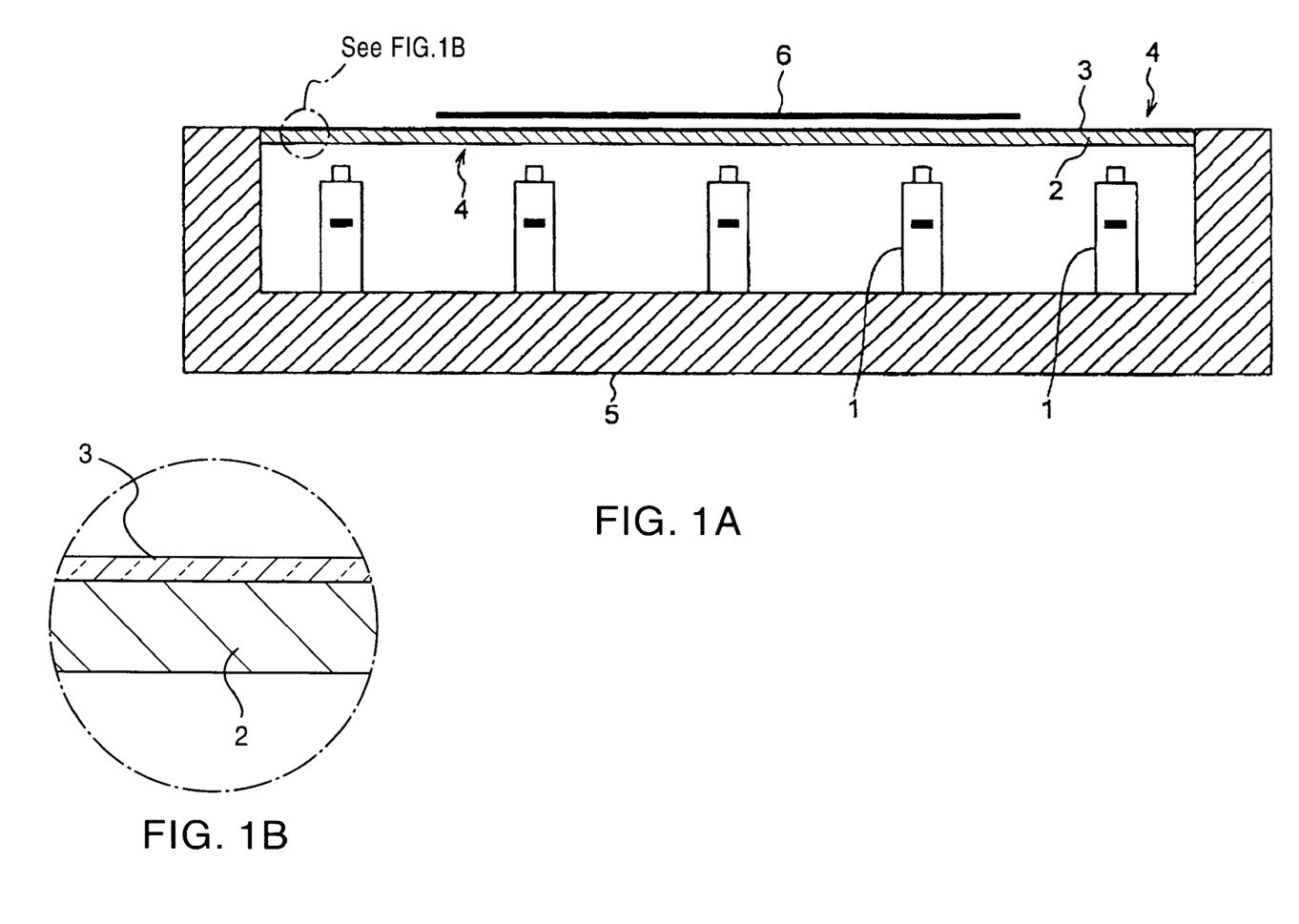
FIG. 1A is a front sectional view of the structure of a heating unit concerning an embodiment according to the present invention.
FIG. 1B is an enlarged view of a portion circled in FIG. 1A.

FIG. 1A is a front sectional view of the structure of a heating unit concerning the embodiment according to the present invention. FIG. 1 B is an enlarged view of a portion circled in FIG. 1A.

In the figure, a light source 1 comprises, for example, an incandescence lamp such as a halogen lamp etc., a discharge lamp such as a xenon lamp, ceramic metal halide lamp etc., from which light having wavelength that is transmitted through a holding member 2 is emitted. That is, the holding member 2 has optical transparency. A holding member 2 is made of glass such as silica glass, borosilicate glass, sintered silica glass, and soda lime glass etc., glass ceramics, translucent alumina, sapphire, and the like.

The heat conducting layer 3 having, for example, 40–100 μm thickness, receives light that transmits the holding member 2 so as to generate heat. The heat conducting layer 3 is made of diamond-like carbon (DLC), metal oxide, such as chromic oxide etc., nitride such as aluminum nitride and boron nitride, silicon carbide, metal such as silver and golden paste, silicide etc. such as molybdenum silicide and the like. A heat conducting plate 4 comprises the holding member 2 and the heat conducting layer 3.

A heating unit main part 5 supports the light source 1 and the heat conducting plate 4. A work piece 6 to be heated by heat generated in the heat conducting layer 3 of the heat conducting plate 4 comprises, for example, a wafer or glass substrate etc.

The diamond-like carbon (DLC), metal oxide, such as chromic oxide etc., nitride such as aluminum nitride and boron nitride, silicon carbide, metal such as silver or golden paste etc., silicide etc. such as molybdenum silicide or the like, which is selected as material of the heat conducting layer, is chemically strong and has excellent heat resistance and high heat conductivity and further blocks light in the range from ultraviolet rays to visible light thereby generating heat.

The diamond-like carbon (DLC) coating of the above-mentioned heat conducting layer 3 to the holding member 2 is carried out by CVD. Coating of the metal oxide such as chromic oxide etc. nitride such as aluminum nitride, boron nitride etc., or silicon carbide etc. is formed by sputtering. Coating of metal such as silver or golden paste etc., is formed by screen printing. Coating of silicide etc. such as molybdenum silicide is formed by CVD, sputtering or heating after vapor deposition. It is possible to control forming a heat conducting layer with a desirable thickness if CVD, sputtering, deposition, or printing is used even when there is slight convexo-concave on the surface of the holding member.

Moreover, since glass, such as silica glass borosilicate glass, sintering silica glass, and soda lime glass, glass ceramics, translucent alumina, and sapphire chosen as material of the holding member, have the small thermal expansion coefficient compared with metal or carbon graphite, so that they are hard to be deformed, and chemically strong, and excel in heat resistance, and mainly light in the range from visible light to ultraviolet rays is transmitted through them so that there is little heat generation.

According to the heating unit of the present invention, light emitted from the light source 1 is irradiated on the heat conducting plate 4, wherein the irradiated light is transmitted through the holding member 2 and is irradiated on the heat conducting layer 3 provided on the side of the work piece 6 of the holding member 2. When the light is irradiated on the heat conducting layer 3, the heat conducting layer 3 generates heat so that the heat is conducted to the work piece 6, such as a wafer and a glass substrate, thereby becoming possible to uniformly heat the work piece 6.

Figure 2:
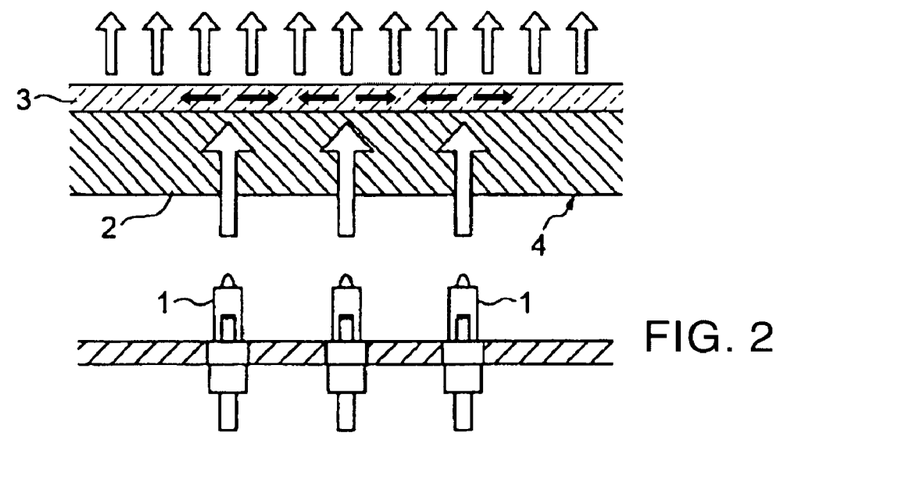
FIG. 2 is a diagram explaining a function of a heat conducting layer.

FIG. 2 is a diagram explaining a function of a heat conducting layer 3, wherein the same reference numbers are assigned to the elements corresponding to those shown in FIGS. 1A and 1B.

As shown in the figure, most part of light which comes out of the light source 1 is transmitted through the holding member 2, and is absorbed in the heat conducting layer 3. When the light is absorbed in the heat conducting layer 3, heat is generated so that heat conduction takes place in the heat conducting plate. Temperature is raised easing the temperature distribution by this action.

Figure 3:
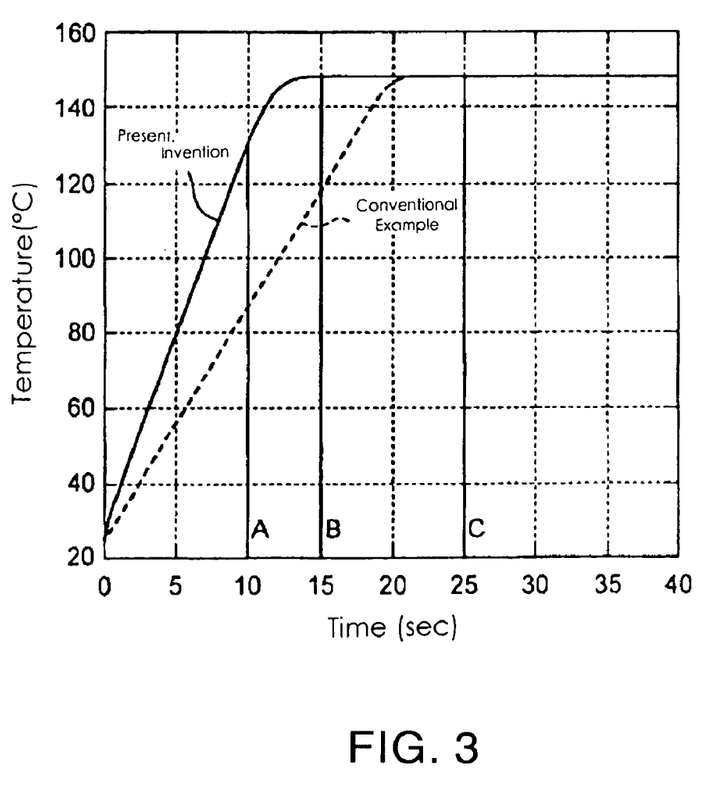
FIG. 3 shows comparison results of temperature rising speed of the heat conducting plate according to the present invention.

FIG. 3 shows comparison results of temperature rising speed of the heat conducting plate according to the present invention in which silica glass having 1 mm thickness is used as the holding member 2 and diamond-like carbon having 100 μm thickness is coated thereon as the heat conducting layer, and the conventional heat spreader in which carbon graphite having 1 mm thickness is used.

In both the case of the heat conducting plate according to the present invention and the case of the conventional heat spreader, five halogen lamps of 55 W power consumption aligned at 56 mm intervals are used as a light source, and the heat conducting plate or heat spreader having 70 mm×260 mm dimension is disposed at a 50 mm distance from the center of the filament and temperature rising characteristic in the ϕ50 center range is measured.

In the measured results as shown in the figure, in case of the heat conducting plate according to the present invention, it took 13 seconds to raise the temperature to a predetermined point. On the other hand, in case of the conventional heat spreader, it took 22 seconds to raise the temperature to the predetermined point. Thus, compared with the conventional heat spreader, in the present invention, it turned out that the temperature raising speed was remarkably improved.

That is, in the heat conducting plate according to the present invention, it is possible to quickly change the temperature, by changing output of the lamp, and by using the heat conducting plate, it is possible to raise the temperature of a work piece for a short time.

Figure 4:
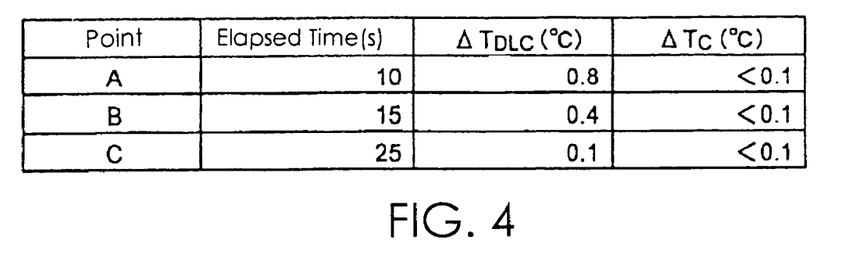
FIG. 4 is a table showing the difference (Δ TDLC ° C.) between the temperature of the heat conducting layer right above the lamp according to the present invention and that of the heat conducting layer between lamps in each lapsed time of the graph shown in FIG. 3, and the difference (ΔTC ° C.) between the temperature of the conventional heat spreader right above a lamp and that of the heat spreader between lamps in each lapsed time of the graph shown in FIG. 3.

FIG. 4 is a table showing the difference (Δ TDLC ° C.) between the temperature of the heat conducting layer right above the lamp according to the present invention and that of the heat conducting layer between lamps in each lapsed time of the graph shown in FIG. 3, and the difference (ΔTC ° C.) between the temperature of the conventional heat spreader right above a lamp and that of the heat spreader between lamps in each lapsed time of the graph shown in FIG. 3.

Although as shown in the table, at a point A after 10 second passes, the difference between the temperature of the heat conducting layer right above the lamp and that of the heat conducting layer between the lamps was 0.8 degree Celsius, the difference between the temperature of the heat conducting layer right above the lamp and that of heat conducting layer between the lamps was 0.1 degree Celsius, at a point C after 25 seconds passes, that is, the difference between the temperature of the conventional heat spreader right above the lamp and temperature of the heat conducting plate between the lamps was approximately 0.1 degree Celsius so that the temperature difference in the case of the present invention and the case of the conventional one is approximately the same (about 0.1 degree Celsius).

Therefore, it is possible to heat the work piece and maintain uniform temperature distribution thereof, with the performance equivalent to that of the conventional heat spreader by using the heat conducting plate according to the present invention.

Furthermore, warpage did not occur after processing the heat conducting plate according to the present invention, and deformation did not occur before and after processing it by heat. This because, in addition to little generation of heat due to light transmission, the holding member of the heat conducting plate has small thermal expansion coefficient, compared with metal or carbon graphite.

Figure 5:
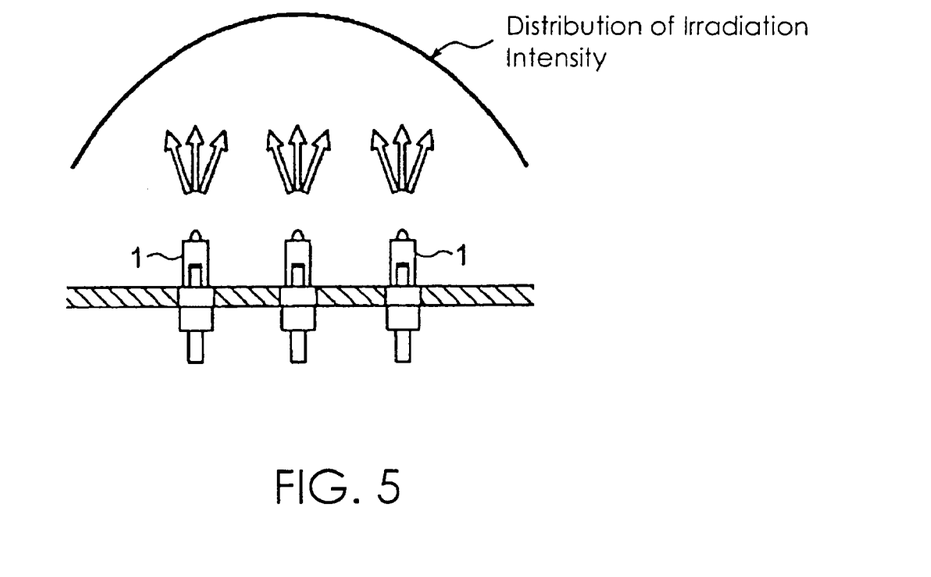
FIG. 5 is a diagram showing irradiation intensity distribution of a lamp in a usual heating unit.

FIG. 5 is a diagram showing irradiation intensity distribution of a lamp in a usual heating unit.

As shown in the figure, irradiation intensity of light from the light source is higher at center thereof and lower at ends thereof so that the distribution of the irradiation intensity is rotation-axis-symmetrical with respect to the center as a whole. Therefore, in case the holding member is processed, it is possible to partially change heat capacity of the heat conducting plate by changing thickness of the holding member.

Figure 6A:
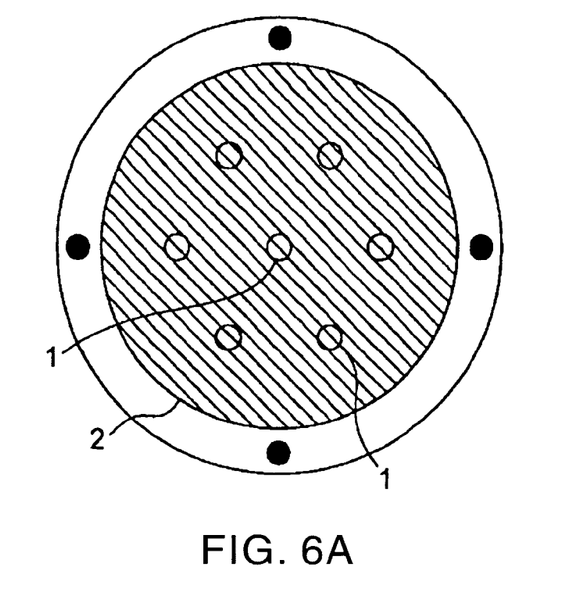
FIG. 6A is a plan view of a heating unit in which the center portion of the holding member of the heat conducting plate is thickened.
Figures 6B, 6C:
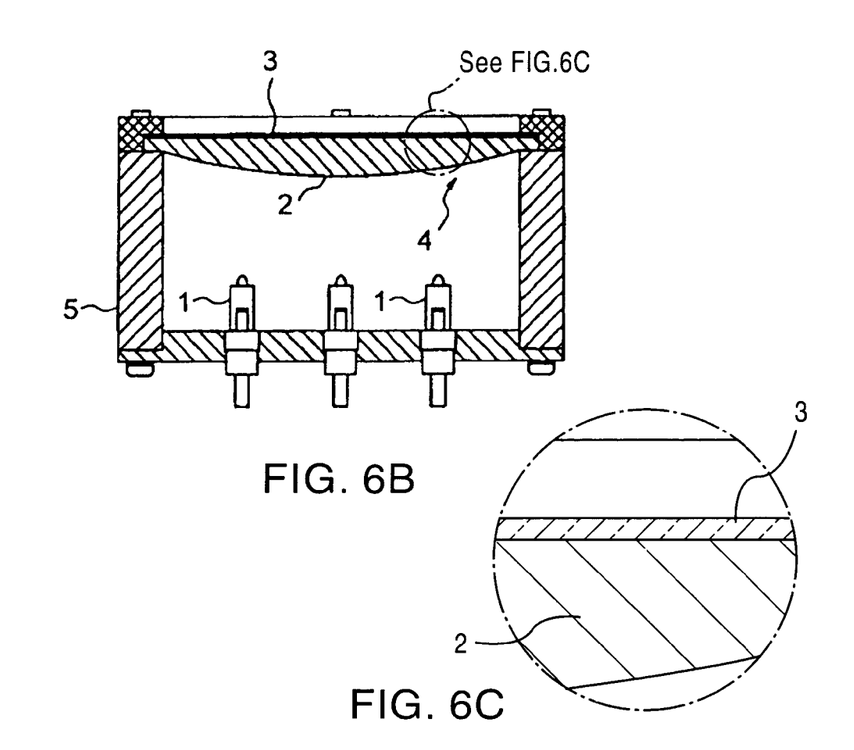
FIG. 6B is a front cross sectional view thereof.
FIG. 6C is an enlarged view of a portion circled in FIG. 6B.

FIG. 6A is a plan view of the heating unit in which the center portion of the holding member of the heat conducting plate is thickened. FIG. 6B is a front cross sectional view thereof. FIG. 6C is an enlarged view of a portion circled in FIG. 6B.

As shown in the figures, if the holding member 2 of the heat conducting plate 4 is processed so that it becomes gradually thin from the center portion toward the end portions, even the irradiation intensity distribution of light from the light source 1 is slightly uneven, it is possible to bring the temperature distribution of the heat conducting layer 3 close to more uniform distribution.

Figure 7A:
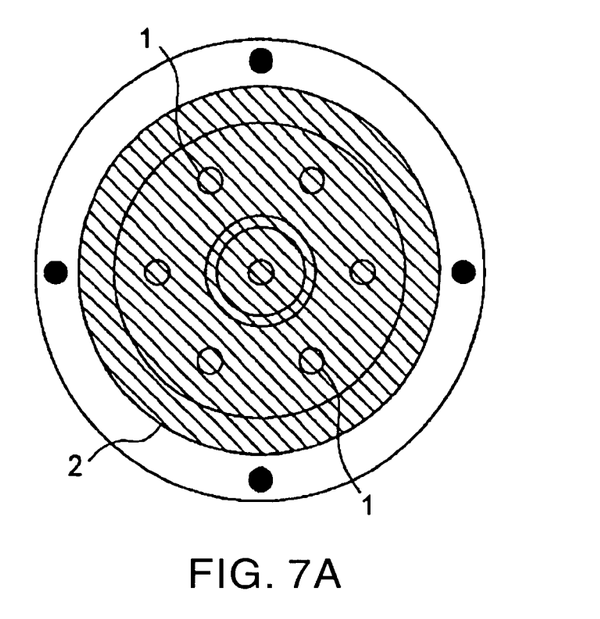
FIG. 7A is a top plan view of a heating unit, showing the structure of the holding member, according to an embodiment of the present invention, in which the mechanical strength of the heat conducting plate is reinforced.
Figures 7B, 7C:
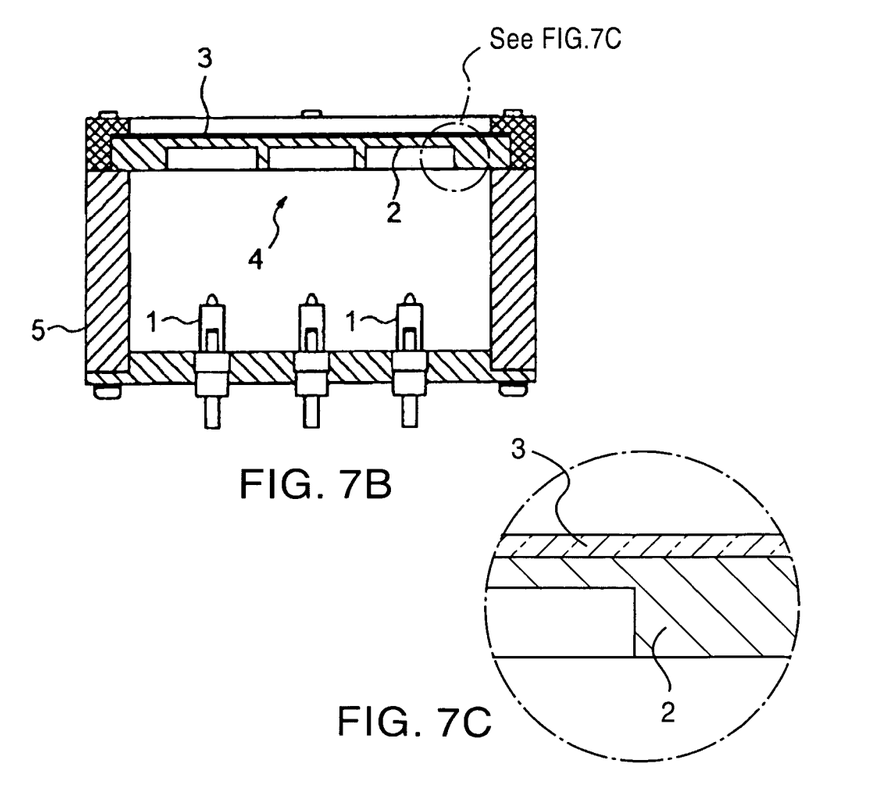
FIG. 7B is a front elevational view thereof.
FIG. 7c is an enlarged view of a portion circled in FIG. 7B.

FIG. 7A is a top plan view of a heating unit, showing the structure of the holding member, according to an embodiment of the present invention, in which the mechanical strength of the heat conducting plate is reinforced. FIG. 7B is a front elevational view thereof. FIG. 7C is an enlarged view of a portion circled in FIG. 7B.

Figure 8A:
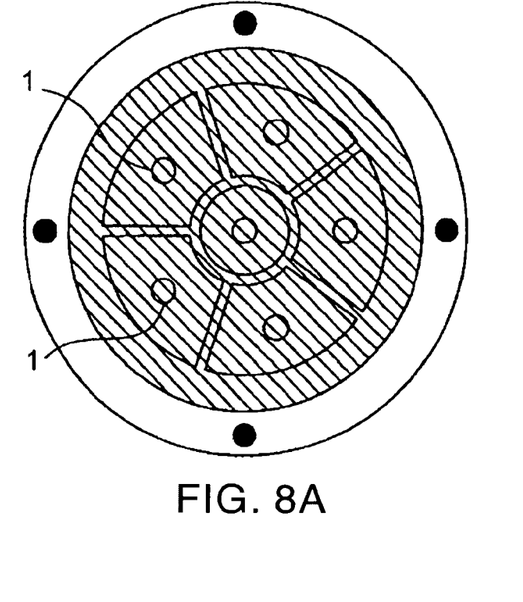
FIG. 8A is a top plan view of the heating unit, showing the structure of the holding member, according to another embodiment, in which the mechanical strength of the heat conducting plate is reinforced.
Figures 8B, 8C:
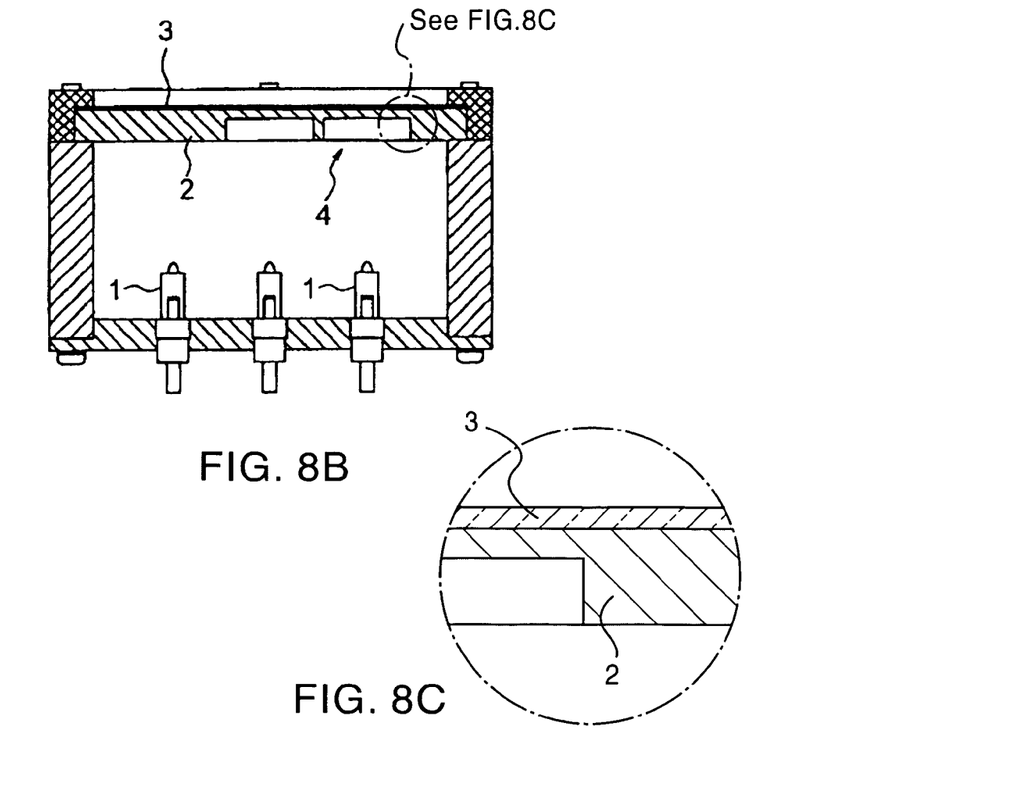
FIG. 8B is a front elevational view thereof.
FIG. 8C is an enlarged view of a portion circled in FIG. 8B.

FIG. 8A is a top plan view of the heating unit, showing the structure of the holding member, according to another embodiment, in which the mechanical strength of the heat conducting plate is reinforced. FIG. 8B is a front elevational view thereof. FIG. 8C is an enlarged view of a portion circlied in FIG. 8B.

Since heat capacity will become small if the thickness of the holding member 2 is made thin, the temperature raising speed of the heat conducting layer 3 becomes fast, but the mechanical strength thereof is deteriorated. Since the holding member 2 can be mechanically processed easily, a portion(s) of the holding member 2, which mainly contribute(s) to heat conduction and is (are) close to the light source 1 is (are) made thin.

On the other hand, if a portion(s) of the holding member 2 which is relatively far from the light source 1 is thickened, and the mechanical strength thereof is mainly given to this portion, it is possible to, by processing, prepare the heat conducting plate 4, in which the mechanical strength is high and the temperature rising speed of the heat conducting layer 3 is also high.

Figure 9A:
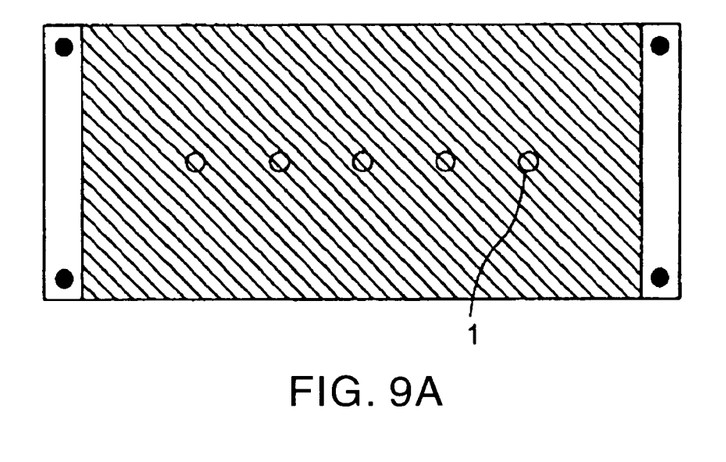
FIG. 9A is a top plane view of the heating unit, showing the structure of the holding member in which the heat conducting plate at one end is thicker than that at the other end.
Figure 9B:
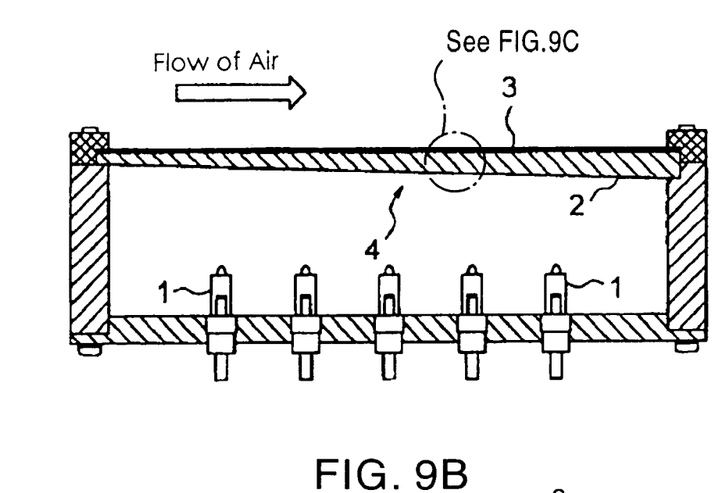
FIG. 9B is a front elevational view thereof.
Figure 9C:
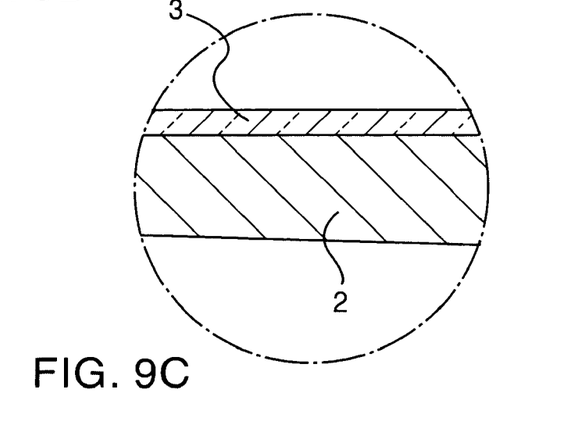
FIG. 9C is an enlarged view of a portion circlied in FIG. 9B.

FIG. 9A is a top plane view of a heating unit, showing the structure of the holding member in which the heat conducting plate (or holding member) at one end is thicker than that at the other end. FIG. 9B is a front elevational view thereof. FIG. 9C is an enlarged view of a portion circled in FIG. 9B.

As shown in FIG. 9B, under a condition in which gas or air moves on the surface of the heat conducting layer 3 in a direction shown in the figure by an arrow, a portion (left end portion of the heat conducting plate 4 in the figure) where the air of the heat conducting plate 4 first blows is cooled. Since the air moves rightward in the figure and receives heat from the heat conducting plate 4, the temperature of the air gradually rises and the air comes to give heat to a portion (right hand side portion of the heat conducting plate 4 in the figure) of the heat conducting plate 4 where the hot air finishes flowing. Therefore, the temperature of the portion where the hot air finishes flowing becomes higher than that of the portion of the heat conducting layer 3, which receives the air first.

Thus, if, as shown in the figure, the holding member 2 becomes thick as the air goes down, the heat capacity of the portion of the heat conducting plate 4 where the air finishes flowing becomes large, so that the temperature of the portion of the heat conducting layer 3 where the air finishes flowing decreases thereby bringing the temperature distribution of the heat conducting layer 3 close to uniform distribution.

Although in the above-mentioned embodiments according to the present invention, the heat conducting plate 4 is located upstream of the light source 1, the same effect also can be expected in case that the heat conducting plate 4 is located downstream of the light source or disposed on the side face.

Thus the present invention possesses a number of advantages or purposes, and there is no requirement that every claim directed to that invention be limited to encompass all of them.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A heating unit for heating a work piece comprising:
   a light source,
   a heat conducting layer, and
   a holding member on which light from the light source is emitted,
   wherein the holding member is provided between the heat conducting layer and the light source, and the heat conducting layer which is provided between the holding member and a work piece, and
   wherein thickness of the holding member is changed according to distribution of irradiation intensity of the light from the light source.

2. The heating unit according to claim 1, wherein the heat conducting layer is made of diamond-like carbon, metal oxide, nitride, silicon carbide, metal, or silicide.

3. The heating unit according to claim 1, wherein the holding member is made of glass, glass ceramics, translucent alumina, or sapphire.

4. The heating unit according to claim 2, wherein the metal oxide is made of diamond-like carbon or chromic oxide.

5. The heating unit according to claim 2, wherein the nitride is aluminum nitride or boron nitride.

6. The heating unit according to claim 2, wherein the metal is silver or golden paste.

7. The heating unit according to claim 2, wherein the silicide is molybdenum silicide.

8. The heating unit according to claim 3, wherein the glass is silica glass, borosilicate glass, sintering silica glass, or soda lime glass.

9. The heating unit according to claim 1, wherein a portion of the holding member, which is adjacent to the light source, is made thinner than other portions of the holding member.

10. The heating unit according to claim 1, wherein a portion of the holding member, which is not adjacent to the light source, is thicker than other portions of the holding member.

11. A heating unit for heating a work piece by heat conduction from a heat conducting plate on which light from a light source is irradiated,
   wherein the heat conducting plate comprises a holding member having optical transparency, and a heat conducting layer which is provided on a surface of the holding member, and absorbs light which is emitted from the light source and is transmitted through the holding member, so as to generate heat,
   wherein thickness of the holding member is changed according to distribution of irradiation intensity of the light from the light source, and
   wherein one end of the holding member is thicker than other end of the holding member.

12. The heating unit according to claim 1, wherein the holding member has at least one recess on a side of the light source.

13. A heating unit for heating a work piece comprising:
   a light source; and
   a holding member having optical transparency; and
   a heat conducting layer,
   wherein the holding member is provided between the heat conducting layer and the light source, and the heat conducting layer which is provided between the holding member and a work piece,
   wherein the heat conducting layer absorbs light which is emitted from the light source and is transmitted through the holding member, and wherein thickness of the holding member is changed according to distribution of irradiation intensity of the light from the light source.

14. The heating unit according to claim 13, wherein the heat conducting layer is made of diamond-like carbon, metal oxide, nitride, silicon carbide, metal, or silicide.

15. The heating unit according to claim 13, wherein the holding member is glass, glass ceramics, translucent alumina, or sapphire.

* * * * *